(12) United States Patent
Fujii

(10) Patent No.: US 11,452,251 B2
(45) Date of Patent: Sep. 20, 2022

(54) INFORMATION MANAGEMENT DEVICE

(71) Applicant: FUJI CORPORATION, Chiryu (JP)

(72) Inventor: Kimio Fujii, Okazaki (JP)

(73) Assignee: FUJI CORPORATION, Chiryu (JP)

(*) Notice: Subject to any disclaimer, the term of this patent is extended or adjusted under 35 U.S.C. 154(b) by 125 days.

(21) Appl. No.: 16/770,321

(22) PCT Filed: Dec. 7, 2017

(86) PCT No.: PCT/JP2017/044079
§ 371 (c)(1),
(2) Date: Jun. 5, 2020

(87) PCT Pub. No.: WO2019/111394
PCT Pub. Date: Jun. 13, 2019

(65) Prior Publication Data
US 2020/0390013 A1 Dec. 10, 2020

(51) Int. Cl.
*B23P 19/00* (2006.01)
*H05K 13/08* (2006.01)
*H05K 13/04* (2006.01)

(52) U.S. Cl.
CPC ....... *H05K 13/089* (2018.08); *H05K 13/0408* (2013.01); *H05K 13/0812* (2018.08); *H05K 13/0818* (2018.08); *Y10T 29/53178* (2015.01)

(58) Field of Classification Search
CPC ............ B81C 1/00238; G06F 11/1048; G05B 2219/45031; H05K 13/08; H05K 13/083; H05K 13/084; H05K 13/04; H05K 13/0812; H05K 13/0818; Y10T 29/53178
USPC ......... 29/740, 593, 705, 710, 739, 829, 832, 29/833
See application file for complete search history.

(56) References Cited

U.S. PATENT DOCUMENTS

| 10,692,738 B2 * | 6/2020 | Fujii ................... H05K 13/083 |
| 2013/0080088 A1 | 3/2013 | Hamaguchi et al. |

FOREIGN PATENT DOCUMENTS

| JP | 2001-210682 A | 8/2001 |
| JP | 2013-69991 A | 4/2013 |
| JP | 2017-117916 A | 6/2017 |
| JP | 2018-56306 A | 4/2018 |
| WO | WO 2016/157356 A1 | 10/2016 |

OTHER PUBLICATIONS

International Search Report dated Feb. 20, 2018 in PCT/JP2017/044079 filed Dec. 7, 2017, 2 pages.

* cited by examiner

Primary Examiner — Thiem D Phan
(74) Attorney, Agent, or Firm — Oblon, McClelland, Maier & Neustadt, L.L.P.

(57) ABSTRACT

An information management device for managing information in a mounting system that mounts a component after determining usability of the component when the component is picked up from a wafer divided into multiple components and is mounted on a base material, includes an information storage section that stores various types of information, an information acquisition section that acquires information on a pickup position of the component on the wafer and information on a determination result of usability of the component, and an information processing section that stores information obtained by associating the pickup position of the component with the determination result of the usability in the information storage section.

7 Claims, 17 Drawing Sheets

(a) NEIGHBORHOOD RANGE (b) NEIGHBORHOOD DIE INFORMATION

|  | PICKUP POSITION | MOUNTING DESTINATION INFORMATION ||
|  |  | BASE MATERIAL ID | MOUNTING POSITION |
| --- | --- | --- | --- |
| SKIP REGISTRATION DIE | $(X_i, Y_j)$ | — | — |
| NEIGHBORHOOD DIE | $(X(i-1), Y(j-1))$ | B-001 | C-**** |
|  | $(X_i, Y(j-1))$ | B-001 | C-**** |
|  | $(X(i+1), Y(j-1))$ | B-001 | C-**** |
|  | $(X(i-1), Y_j)$ | B-*** | D-**** |
|  | $(X(i+1), Y_j)$ | B-*** | D-**** |
|  | $(X(i-1), Y(j+1))$ |  |  |
|  | $(X_i, Y(j+1))$ |  |  |
|  | $(X(i+1), Y(j+1))$ |  |  |

INFORMATION MANAGEMENT DEVICE

TECHNICAL FIELD

The present specification discloses an information management device and an information management method.

BACKGROUND ART

In the related art, an information management device that manages information on a mounting system which performs a mounting process of mounting a supplied component on a base material has been known. For example, when a wafer or the like, from which multiple components such as dies can be picked up, is provided for mounting the components on a base material, an information management device of Patent Literature 1 acquires pickup source information, including a pickup position of the component from the wafer, and mounting destination information, including a mounting position of the component on the base material, and the information management device stores the pickup source information and the mounting destination information in association with each other. Thereby, if the pickup source information is obtained from the mounting destination information, it is possible to specify the pickup position of the wafer on which the component has been picked up. Accordingly, for example, when a result of inspection of the mounted component fails, such information can be utilized to know whether there is a relationship between the pickup position and the failure.

PATENT LITERATURE

Patent Literature 1: WO2016/157356

BRIEF SUMMARY

Technical Problem

As described above, such an information management device is required to manage information so that a relationship between a pickup position of a component and a failure can be appropriately grasped. Further, since the component is mounted on a subsequent base material even before results of inspection of the component come out, utilization of the information is required more overly such that the information can be quickly fed back for suppressing further occurrence of a failure.

A main object of the present disclosure is to utilize information more effectively that are acquired when multiple components are picked up from a wafer and mounted on a base material.

Solution to Problem

The present disclosure adopts the following sections in order to achieve the main object described above.

An information management device of the present disclosure is an information management device for managing information in a mounting system that mounts a component after determining usability of the component when the component is picked up from a wafer divided into multiple components and is mounted on a base material, and includes an information storage section that stores various types of information, an information acquisition section that acquires information on a pickup position of the component on the wafer and information on a determination result of usability of the component, and an information processing section that stores information obtained by associating the pickup position of the component with the determination result of the usability in the information storage section.

An information management device of the present disclosure acquires information on a pickup position of a component on a wafer and information on a determination result of usability of the component, and the information management device stores information, in which the pickup position of the component is associated with the determination result of usability of the component. Thereby, the information management device makes it possible to grasp tendency of a position of a component which is determined to be unusable on the wafer from the stored information, or specify a component which is picked up from neighborhood of the component having been determined to be unusable, or the like. Accordingly, information having been acquired at the time of mounting a component can be effectively utilized, which enables to take quick measures without waiting for an inspection result and the like for a component that is picked up from the wafer and mounted on a base material.

DESCRIPTION OF EMBODIMENTS

First Embodiment

Figure 1:
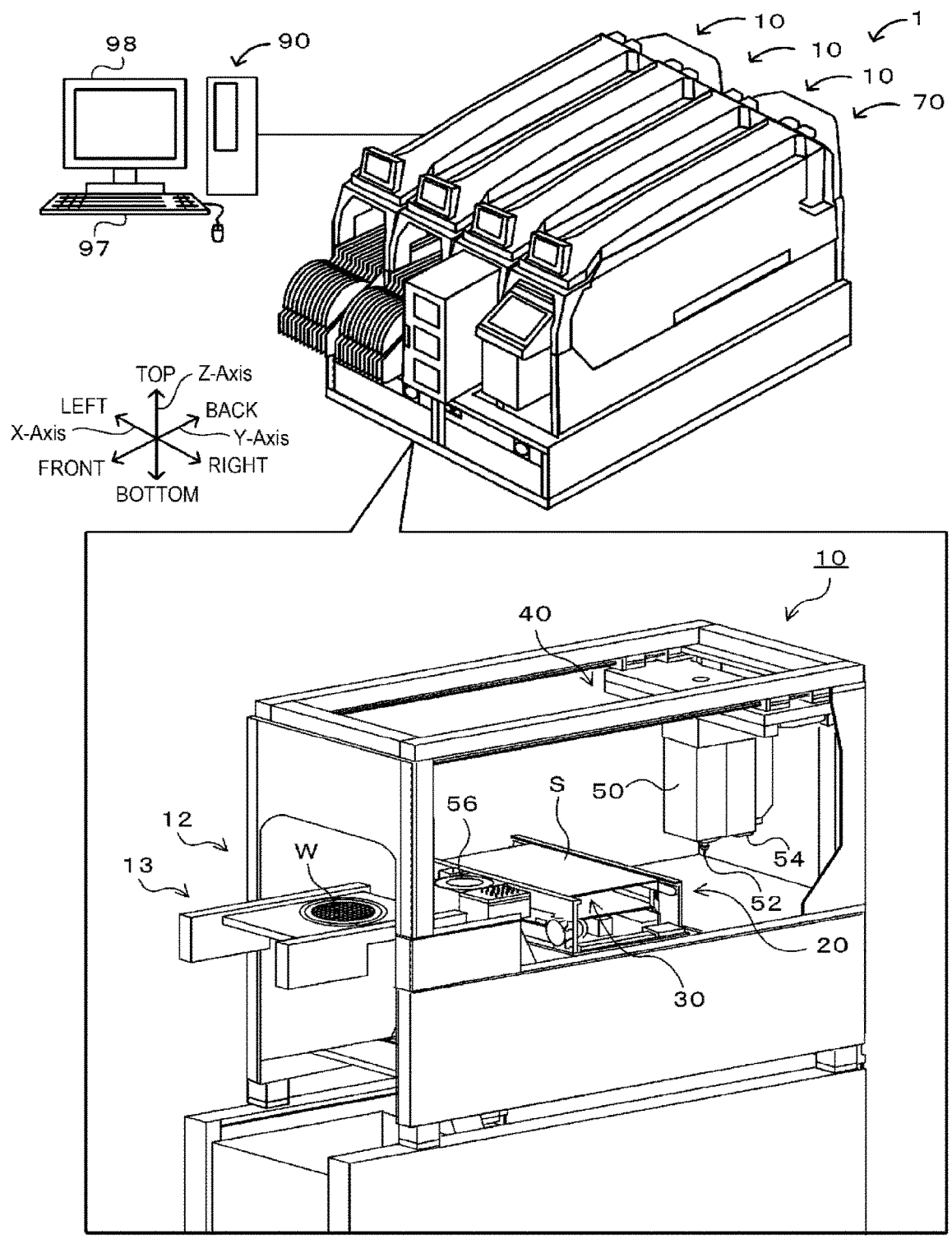
FIG. 1 is a configuration diagram illustrating an outline of a configuration of mounting system 1.
Figure 2:
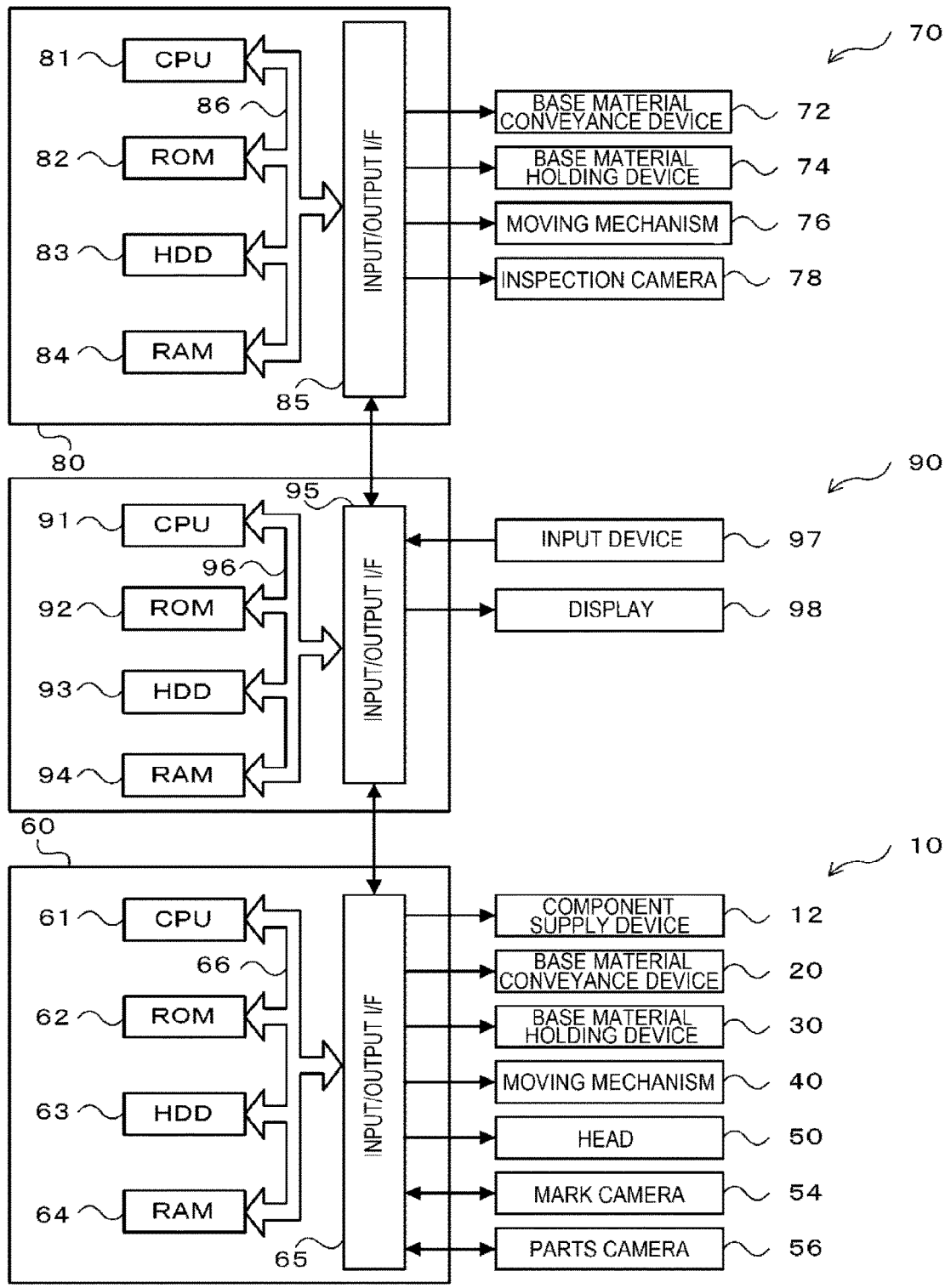
FIG. 2 is a block diagram illustrating an electrical coupling relationship of mounting system 1.
Figure 3:
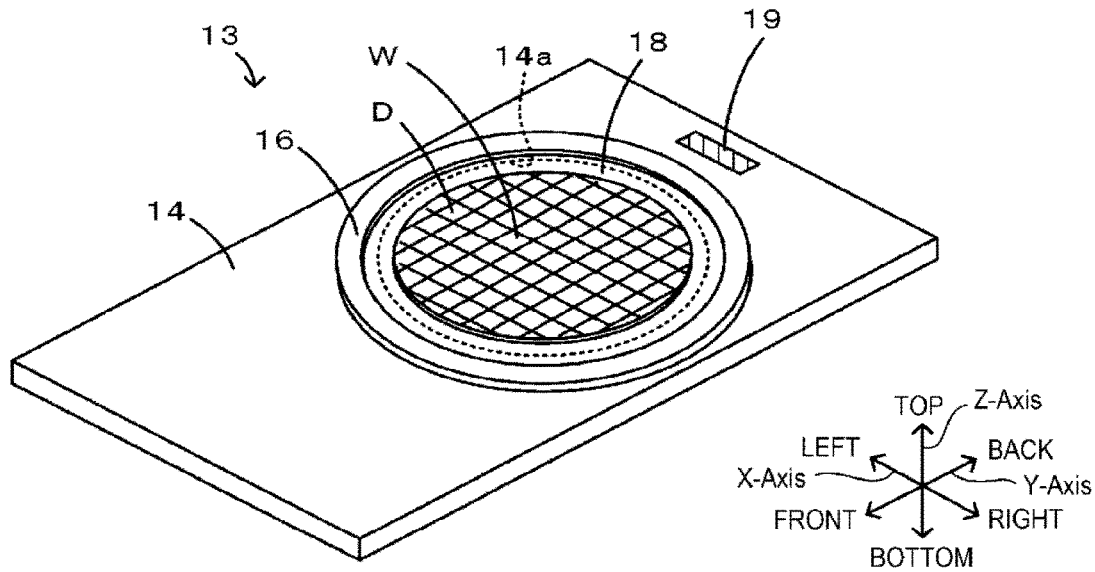
FIG. 3 is a perspective view of wafer pallet 13.

The following is a description of the first embodiment of the present disclosure. FIG. 1 is a configuration diagram illustrating an outline of a configuration of mounting system 1, FIG. 2 is a block diagram illustrating an electrical coupling relationship of mounting system 1, and FIG. 3 is a perspective view of wafer pallet 13. In the present embodiment, a left-right direction in FIG. 1 is an X direction, a front-back direction is a Y direction, and a vertical direction is a Z direction. Mounting system 1 includes multiple mounters 10 for mounting a component on base material S, inspection device 70 that is provided on a downstream side of mounter 10 in a base material convey direction and inspects a mounting state of the component, and management device 90 that manages various types of information on a mounting process and inspection processing. Mounter 10 includes, as a component supply device for supplying components, a device that supplies components from a tape reel containing the components, a device that supplies components (dies D) from a wafer pallet on which wafer W is placed, and the like, and the latter will be described in the present embodiment.

As illustrated in FIG. 1, mounter 10 includes component supply device 12 that supplies die D from wafer pallet 13 on which wafer W divided into multiple components (dies D) is placed; base material convey device 20 that conveys base material S having a flat plate shape; base material holding device 30 that holds conveyed base material S; head 50 that picks up die D supplied from component supply device 12 by picking up by suction with suction nozzle 52 and mounts die D on base material S; moving mechanism 40 that moves head 50 in the XY directions; an ID mark indicating a base material ID attached to a predetermined position on base material S or an ID mark indicating wafer ID attached to a predetermined position on wafer pallet 13; mark camera 54 that can capture an image of die D and the like supplied to component supply device 12 from above; parts camera 56 that can capture an image of die D picked up by suction nozzle 52 from below; and mounting control device 60 (see FIG. 2) that controls entire mounter 10.

As illustrated in FIG. 3, wafer pallet 13 includes rectangular pallet main body 14 having open circular hole 14a, and expandable and contractible adhesive sheet 18 fixed to pallet main body 14 by grip ring 16 in a state of being expanded to close circular hole 14a. Wafer W on which a large number of rectangular dies D are formed adheres to a top surface of adhesive sheet 18. Die D is formed by forming a circuit using pattern printing before scribing wafer W, and then scribing wafer W. ID mark 19 indicating wafer ID is attached to a top surface of wafer pallet 13. The wafer ID indicates a type, a manufacture number, and the like of wafer W. A push-up pin (not illustrated) is disposed below adhesive sheet 18. The push-up pin facilitates peeling of die D from adhesive sheet 18 by push die D upward from below adhesive sheet 18 when die D is picked up by suction by suction nozzle 52.

Figure 4:
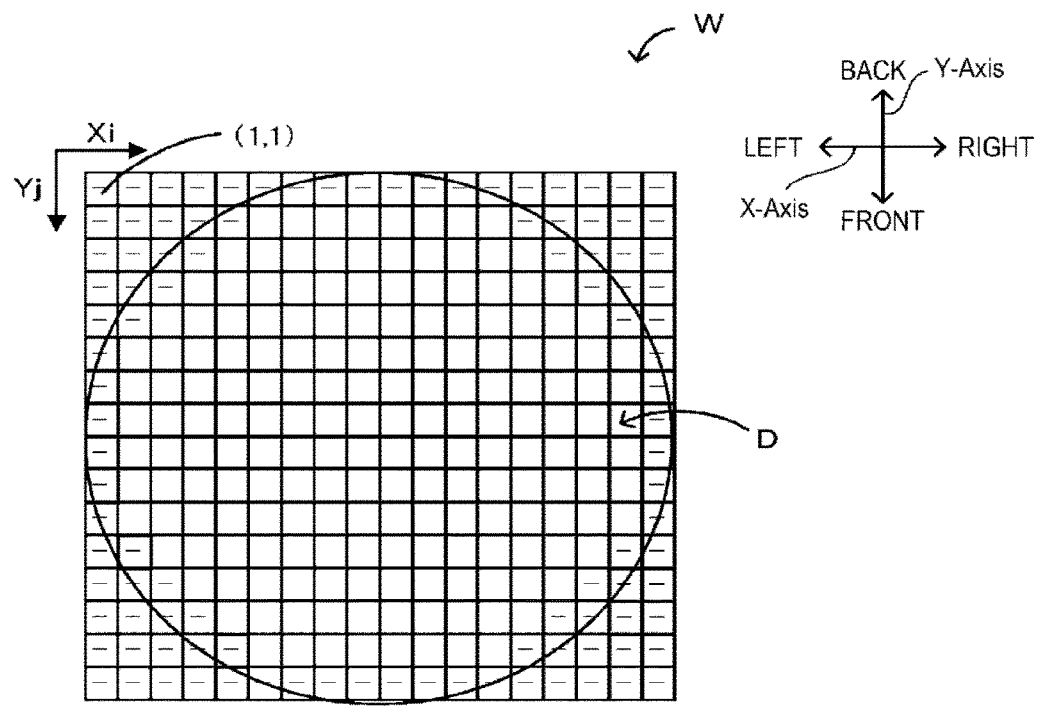
FIG. 4 is an explanatory diagram illustrating a pickup position of die D in wafer W.

FIG. 4 is an explanatory diagram illustrating a pickup position of die D picked up from wafer W. As illustrated in the drawing, the pickup position of die D is represented by, for example, pickup position coordinates (X,Y) in an XY coordinate system in which an upper left corner is set as a reference position (1,1) and a coordinate interval based on a size of die D is determined. In the drawing, a "-" mark indicates a position deviated from wafer W or a position where chip may be formed in the shape of die D located in the neighborhood of an outer edge of wafer W, and indicates that die D is not picked up. Head 50 (suction nozzle 52) sequentially picks up dies D, for example, from the left to the right in FIG. 4 and if pickup of dies D in one line is completed, a process of moving to a next lower line to repeatedly pick up dies D.

As illustrated in FIG. 2, mounting control device 60 is configured as a microprocessor focused on CPU 61 and includes ROM 62, HDD 63, RAM 64, and input/output interface 65 in addition to CPU 61. These are electrically coupled to each other via bus 66. Mounting control device 60 receives an image signal from mark camera 54, an image signal from parts camera 56, and the like via input/output interface 65. Meanwhile, mounting control device 60 outputs a drive signal to component supply device 12 or a drive signal to base material conveyance device 20, a drive signal to base material holding device 30, a drive signal to moving mechanism 40, a drive signal to head 50, and the like via input/output interface 65. Mounting control device 60 is coupled to management device 90 via a communication network so as to be capable of performing a bidirectional communication, and exchanges data and control signals with each other. In addition, mounting control device 60 stores a pickup position coordinate map of die D based on a type of wafer W (size of wafer W or size of scribed die D) in HDD 63, and if wafer W is supplied, mounting control device 60 reads a pickup position coordinate map corresponding to the type of wafer W. The pickup position coordinate map is stored as input by an operator.

As illustrated in FIG. 2, inspection device 70 includes base material conveyance device 72 that conveys base material S on which components such as dies D are mounted, base material holding device 74 that holds conveyed base material S, inspection camera 78 that captures an inspection image for inspecting mounted components such as dies D, moving mechanism 76 that moves inspection camera 78 in the XY direction, and inspection control device 80 that controls an entirety of inspection device 70. Base material conveyance device 72, base material holding device 74, and moving mechanism 76 are configured in the same manner as base material conveyance device 20, base material holding device 30, and moving mechanism 40 of mounter 10, respectively.

Inspection control device 80 is configured in the same manner as mounting control device 60 and includes CPU 81, ROM 82, HDD 83, RAM 84, and input/output interface 85. These are electrically coupled to each other via bus 86. Inspection control device 80 receives an image signal and the like from inspection camera 78 via input/output interface 85. Meanwhile, inspection control device 80 outputs a drive signal to moving mechanism 76, an imaging signal to inspection camera 78, and the like via input/output interface 85. Inspection control device 80 is coupled to management device 90 via a communication network so as to be capable of performing a bidirectional communication and exchanges data and control signals with each other.

Management device 90 is, for example, a general-purpose computer and includes CPU 91, ROM 92, HDD 93, RAM 94, input/output interface 95, and the like. These are electrically coupled to each other via bus 96. Management device 90 receives an input signal from input device 97 such as a mouse or a keyboard via input/output interface 95. Meanwhile, management device 90 outputs an image signal to display 98 via input/output interface 95. HDD 93 stores a production schedule of base material S. The production schedule of base material S refers to a schedule for determining which components (dies D) are mounted at which position and in which order on a mounting surface of base material S in mounter 10, and how many base materials S on which components are mounted as such are produced. In addition, the production schedule includes information on base material S, information on wafer W, mounting position information on components (dies D), and the like. These are acquired by an input of an operator. In addition, management device 90 outputs a command signal to mounting control device 60 such that component are mounted according to the production schedule and outputs a command signal to inspection control device 80 such that base material S on which the components are mounted is inspected.

Figure 5:
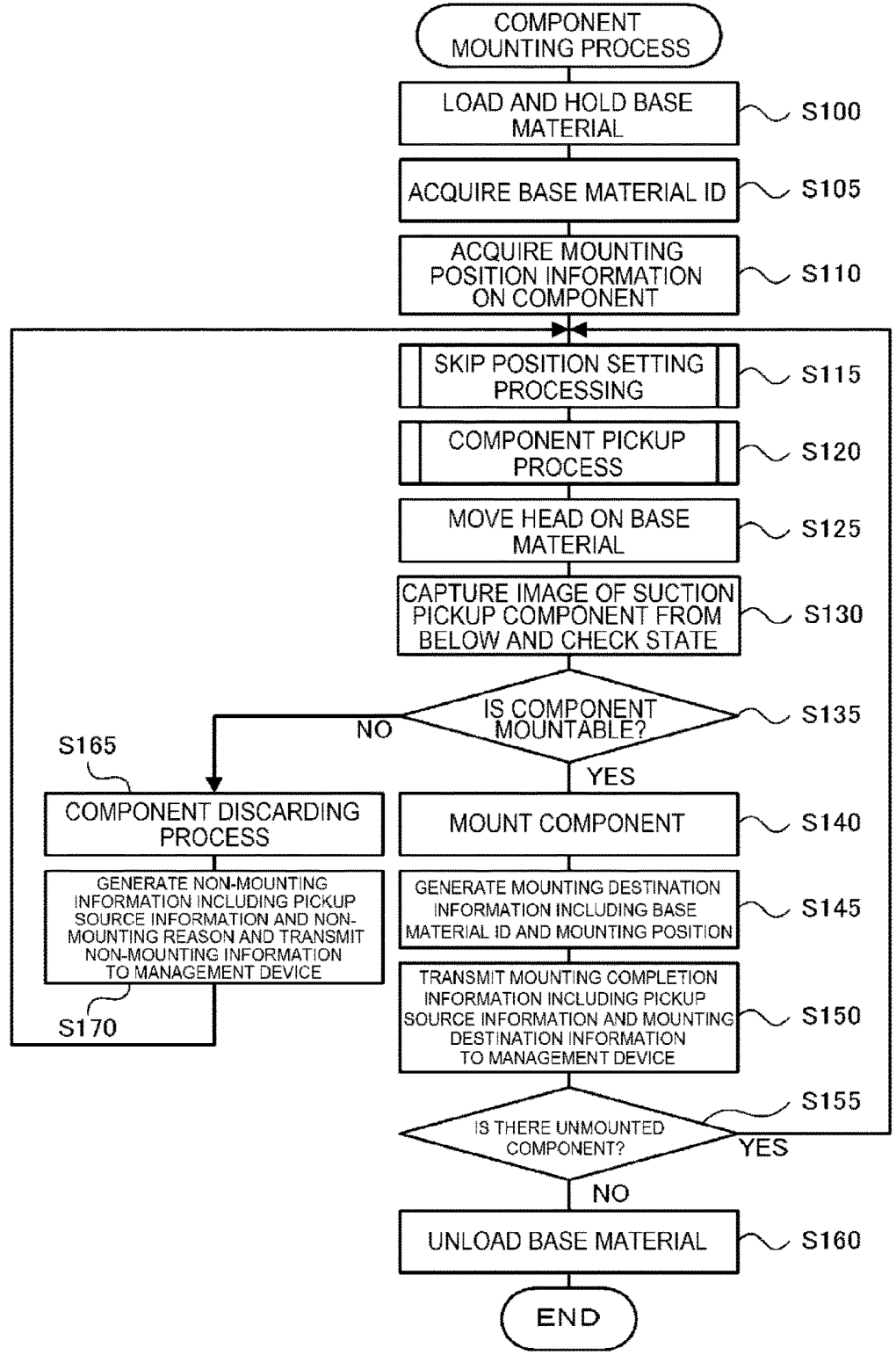
FIG. 5 is a flowchart illustrating an example of a component mounting process.

The following is description of an operation of mounting system 1. First, a component mounting process by which mounter 10 mounts a component on base material S will be described. In the following, a case in which one mounter 10 picks up die D from wafer W to mount will be described as an example. FIG. 5 is a flowchart illustrating an example of a component mounting process performed by CPU 61 of mounting control device 60. In this component mounting process, CPU 61 first controls base material conveyance device 20 to load base material S onto base material holding device 30, and then controls base material holding device 30 to hold base material S (S100). Next, CPU 61 captures an image of ID mark at a predetermined position on base material S with mark camera 54 to acquire a base material ID (S105), and acquires mounting position information for mounting each component on base material S based on the acquired base material ID and the received command signal (S110). Subsequently, CPU 61 performs skip position setting processing for setting a position at which suction pickup of die D of a part of wafer W is skipped (S115), and performs a component pickup process for picking up die D by causing suction nozzles 52 to pick up by suction die D at a pickup position which has not been set to a skip position in the skip position setting processing (S120).

Figure 6:
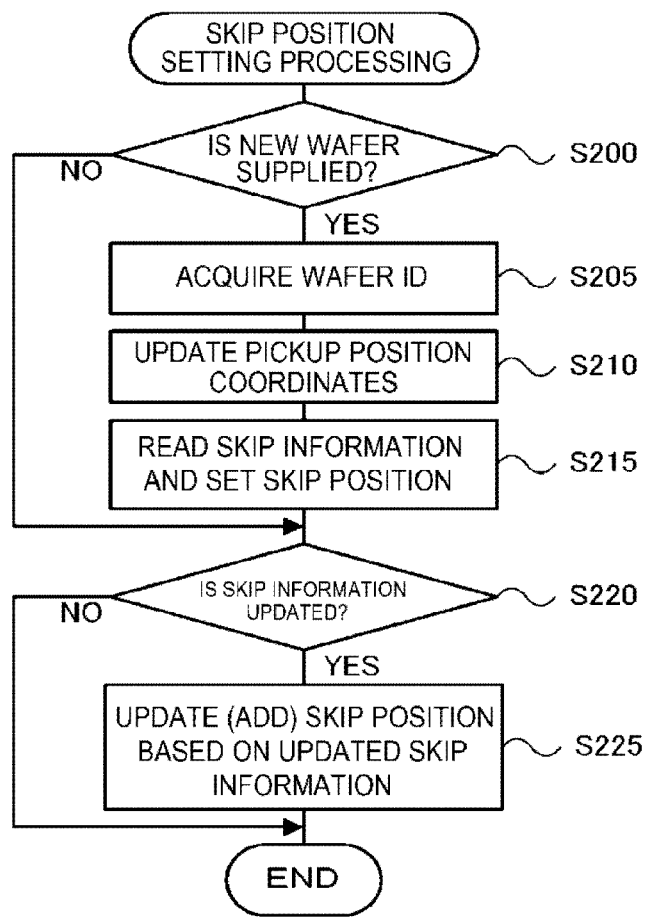
FIG. 6 is a flowchart illustrating an example of skip position setting processing.

FIG. 6 is a flowchart illustrating an example of the skip position setting processing. In the component pickup process, CPU 61 first determines whether new wafer W has been supplied from component supply device 12 (S200). When CPU 61 determines that new wafer W has been supplied, mark camera 54 captures image of ID mark 19 at a predetermined position on wafer pallet 13 and acquires the wafer ID (S205). Then, CPU 61 reads pickup position coordinates corresponding to a wafer type based on the acquired wafer ID from HDD 63 to update the pickup position coordinates for picking up die D (S210), and reads skip information from HDD 63 to set a skip position (S215). Here, the skip information is information transmitted from management device 90 in association with a type of wafer W and the skip position. CPU 61 stores the skip information received from management device 90 in HDD 63, and in S215, it is assumed that the skip position information corresponding to the wafer type is read. CPU 61 skips S215 if the skip information corresponding to the wafer type is not stored in HDD 63. The skip position setting processing is repeatedly performed during the component mounting process, and CPU 61 skips S205 to S215 if it is determined that new wafer W is not supplied in S200.

Subsequently, CPU 61 determines whether the skip information is updated (S220). After setting the skip position in S215, CPU 61 determines S220 based on whether new skip information is received from management device 90. If it is determined that the skip information is updated, CPU 61 updates the skip position based on the skip information (S225) and ends the skip position setting processing, and if it is determined that the skip information is not updated, CPU 61 ends the skip position setting processing as it is. As will be described below, the skip information is newly transmitted from management device 90 when a skip position is newly registered because an unusability rate of dies D is very high, and thus, a skip position is added in S225.

Figure 7:
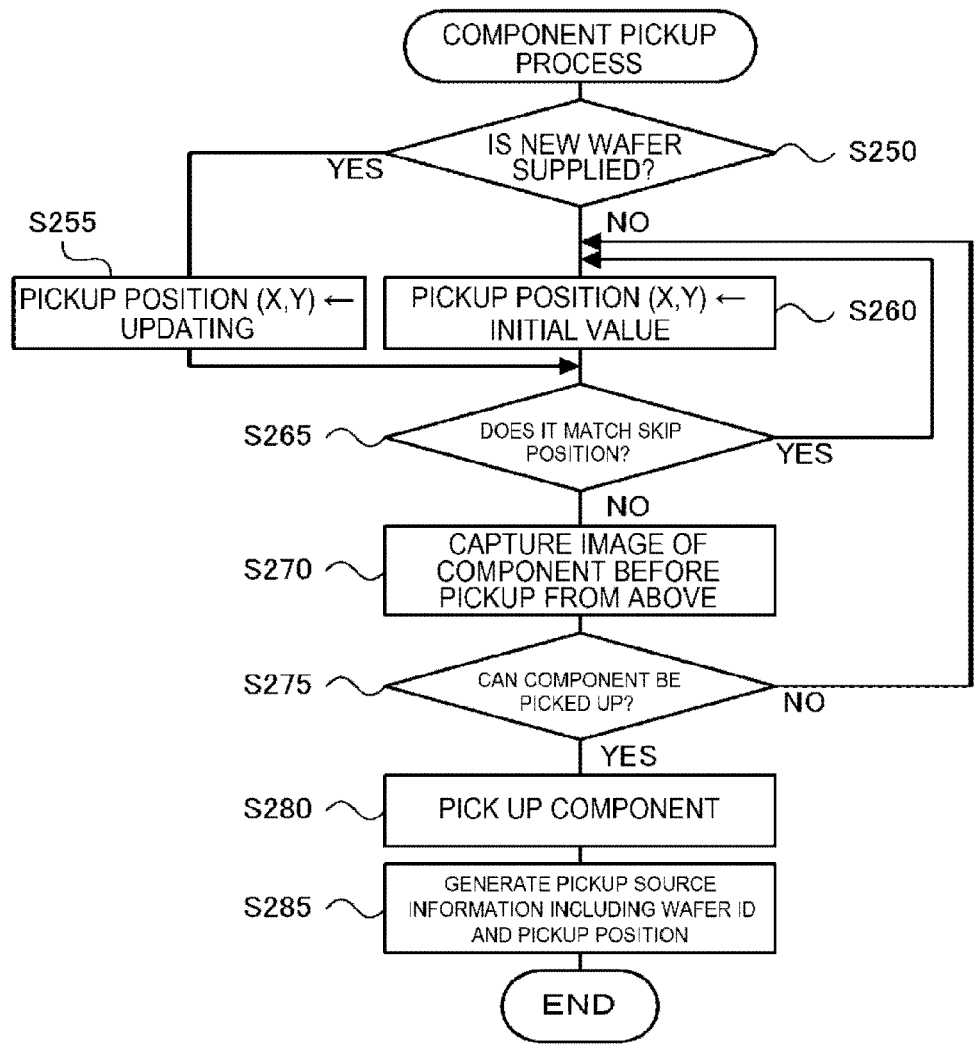
FIG. 7 is a flowchart illustrating an example of a component pickup process.

FIG. 7 is a flowchart illustrating an example of the component pickup process. In the component pickup process, CPU 61 first determines whether new wafer W has been supplied from component supply device 12 (S250), sets the pickup position coordinates (X,Y) to an initial value if it is determined that new wafer W has been supplied (S255), and updates the pickup position coordinates (X,Y) to a next pickup position if it is determined that die D has been picked up from wafer W that is not new wafer W (S260). In S255, CPU 61 sets uppermost and leftmost pickup position coordinates from among the coordinates on wafer W from which die D can be picked up to an initial value. In addition, in S260, if pickup position coordinates of an adjacent position of which a value is incremented by 1 in the X direction with respect to pickup position coordinates of previous die D are valid, CPU 61 updates the pickup position to that position, and if the pickup position coordinates of the adjacent position is not valid, CPU 61 increments the value by 1 in the Y direction and updates the pickup position to a leftmost position where a component can be picked up in the X direction. Subsequently, CPU 61 determines whether current pickup position coordinates match a skip position set by skip position setting processing in S115 (S265), and if it is determined that the current pickup position coordinates match the skip position, CPU 61 repeats updating the pickup position coordinates (X,Y) of S260 until it is determined that the current pickup position coordinates do not match the skip position. Thereby, CPU 61 can prevent die D at the skip position designated by the skip information, which is transmitted from management device 90 and stored in HDD 63, from being used. That is, it is possible to prevent die D at the skip position from being mounted on base material S.

Next, CPU 61 captures an image of predetermined range including a current pickup position from above with mark camera 54 (S270), and processes the obtained image to determine whether die D can be picked up (S275). In the imaging processing, CPU 61 compares a reference image of normal die D with a captured image and determines whether die D is missing, whether there is a shape failure such as crack or chip, or whether there is a skip mark added to a top surface of die D. The skip mark is added to the top surface of die D before being loaded into mounter 10 such that abnormal die D is not picked up. If it is determined that die D cannot be picked up because die D is missing, die D has a shaping failure, or the skip mark is added to die D, CPU 61 does not pick up die D and processing returns to S260. That is, the processing of S275 determines usability of die D. If it is determined that die D can be picked up, CPU 61 controls moving mechanism 40 to locate suction nozzle 52 on the pickup position and controls head 50 to cause suction nozzle 52 to pick up by suction die D, and thus, die D at the pickup position coordinates (X,Y) is picked up (S280). Then, CPU 61 generates pickup source information including a wafer ID acquired in S205 of skip position setting processing and pickup position coordinates (X,Y) at which die D is picked up this time (S285), and ends the component pickup process.

Returning to the component mounting process of FIG. 5, CPU 61 then controls moving mechanism 40 to move head 50 onto parts camera 56 via base material S (S125). When head 50 is above parts camera 56, CPU 61 captures image of die D picked up by suction by suction nozzles 52 from below to parts camera 56, processes the obtained image, checks a state of die D (component picked up by suction)

(S130), and determines whether die D is mountable (S135). In S135, CPU 61 determines whether die D is mountable based on presence or absence of a suction pickup posture failure such as a large inclination of a suction pickup posture of die D, or determines whether die D is mountable based on presence or absence of a shape failure of die D such as crack or chip.

Figure 8:
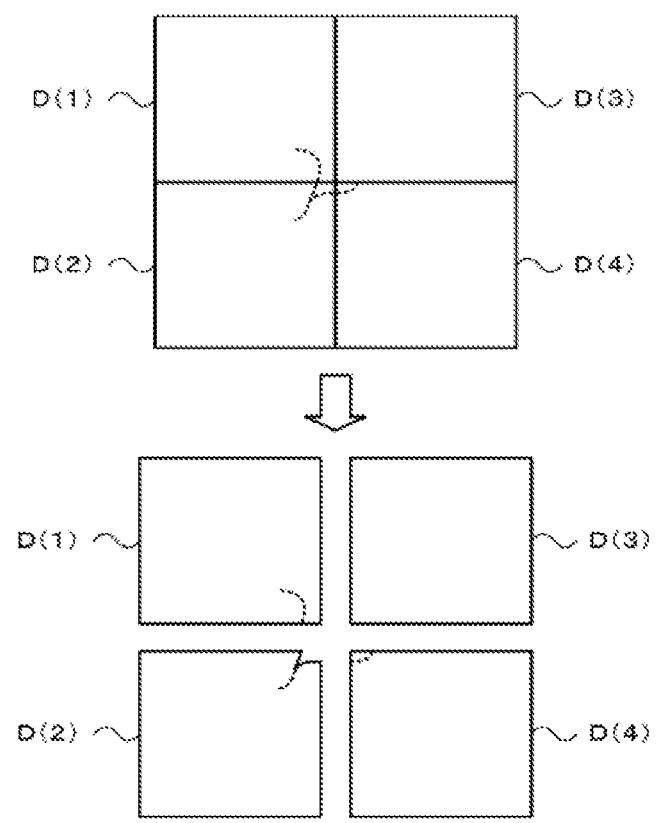
FIG. 8 is an explanatory diagram illustrating an example of a shape failure of die D.

Here, FIG. 8 is an explanatory diagram illustrating an example of a shape failure of die D. FIG. 8(a) illustrates a state before die D is picked up from wafer W, and FIG. 8(b) illustrates a state after die D is picked up from wafer W. As illustrated in FIG. 8(a), when a linear crack or the like occurs in die D, even if an image is captured from above by mark camera 54, a shape failure is not detected because the crack is hard to see in the image thereby being unable to distinguish Accordingly, dies D(1) to D(4) may be picked up as determined to be capable of being picked up. Then, if dies D are individually picked up by suction of suction nozzle 52, die D(2) having obvious crack or chip is detected as a shape failure because the chip can be distinguished from the image captured by parts camera 56. Meanwhile, linear crack illustrated in dies D(1) and D(3) may be mounted on base material S because the dies can be hardly distinguished from an image thereby being not detected. As in this example, crack or chip may extend to not only one die D, but also peripheral multiple dies D. Further, even if there is no crack or chip in die D before pickup, when die D is picked up by suction by suction nozzle 52, crack or chip may occur due to an impact caused by excessive push-in of suction nozzle 52 or excessive push-up of the push-up pin. Accordingly, even if die D is determined to be capable of being picked up in the component pickup process, it may be determined that die D is unable to be mounted in S135. As described above, processing of S135 is to determine usability of die D.

If it is determined that die D is mountable in S135, CPU 61 controls head 50 to mount die D on base material S in S140 with suction nozzle 52. Subsequently, CPU 61 generates mounting destination information including the base material ID acquired in S105 and a mounting position this time (S145), and transmits mounting completion information including the pickup source information and the mounting destination information to management device 90 (S150). Then, CPU 61 determines whether there is unmounted die D (S155), and if there is unmounted die D, CPU 61 returns to S115 to perform processing, and if there is no unmounted die D, CPU 61 unloads base material S (S160) and ends the component mounting process. In addition, if it is determined that die D cannot be mounted in S135 due to a posture failure or a shape failure of die D, CPU 61 controls moving mechanism 40 to move head 50 to a predetermined discarding position to discard die D (S165), generates non-mounting information including the pickup source information and a non-mounting reason (discarding reason), and transmits the non-mounting information to management device 90 (S170). CPU 61 generates the non-mounting information such that a shape failure and a posture failure can be distinguished as the non-mounting reason. The non-mounting reason is not limited to these two reasons, and may be more precisely distinguished. Such non-mounting is also referred to as an imaging processing error because the non-mounting is based on a failure detected by processing an image captured by parts camera 56. If the non-mounting information is transmitted to management device 90 in S170, CPU 61 returns to S115 and performs the processing.

Figure 9:
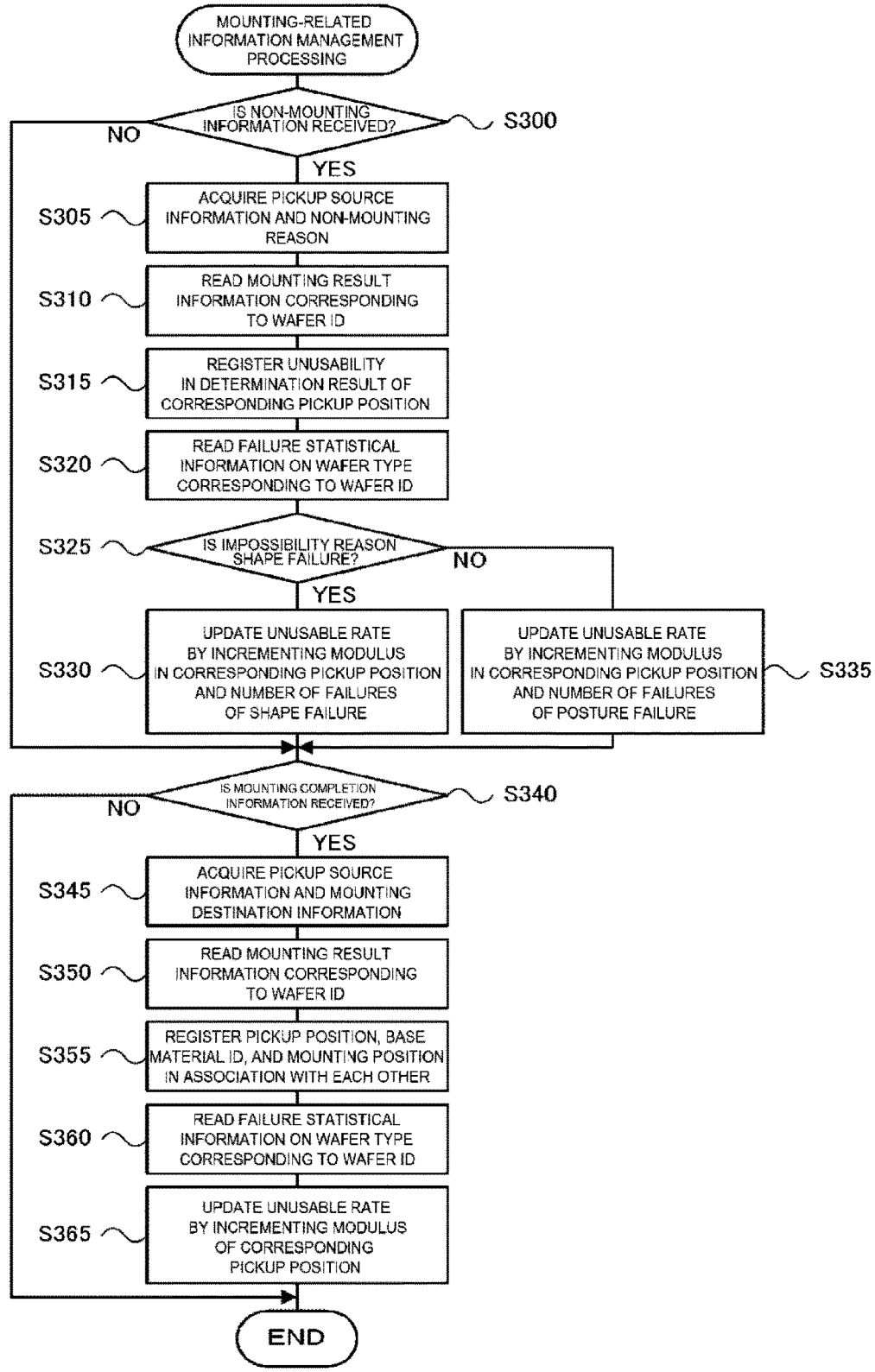
FIG. 9 is a flowchart illustrating an example of mounting-related information management processing.
Figure 10:
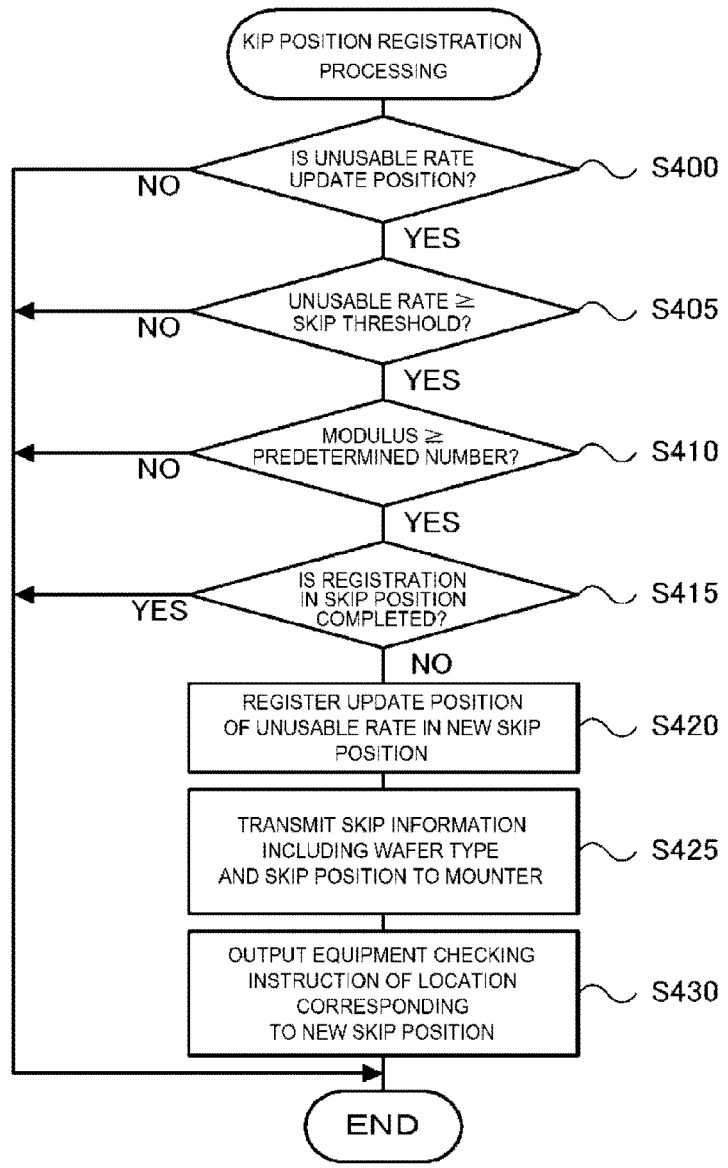
FIG. 10 is a flowchart illustrating an example of skip position registration processing.
Figure 11:
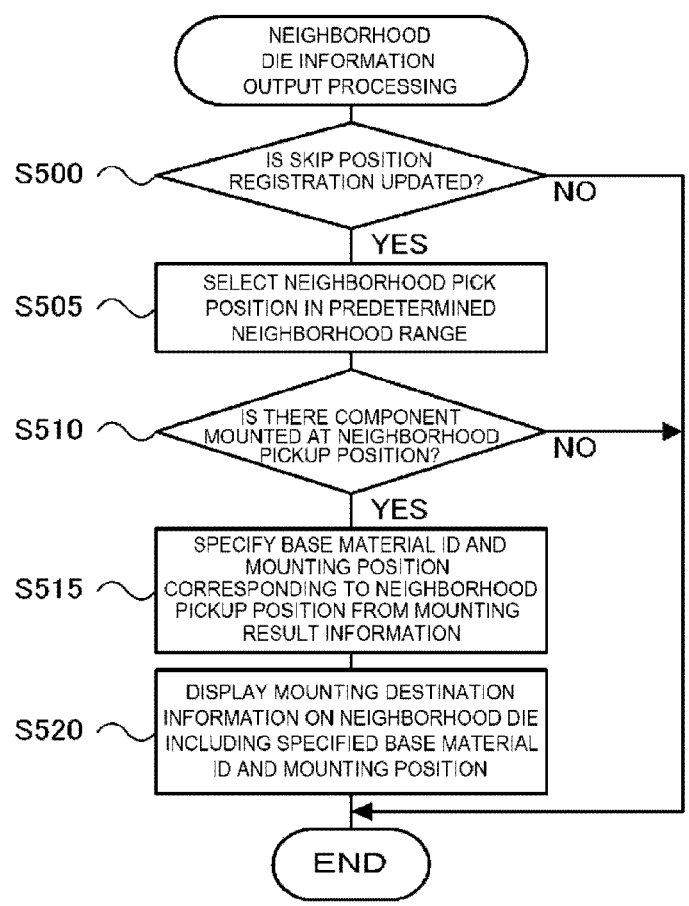
FIG. 11 is a flowchart illustrating an example of neighborhood die information output processing.
Figure 12:
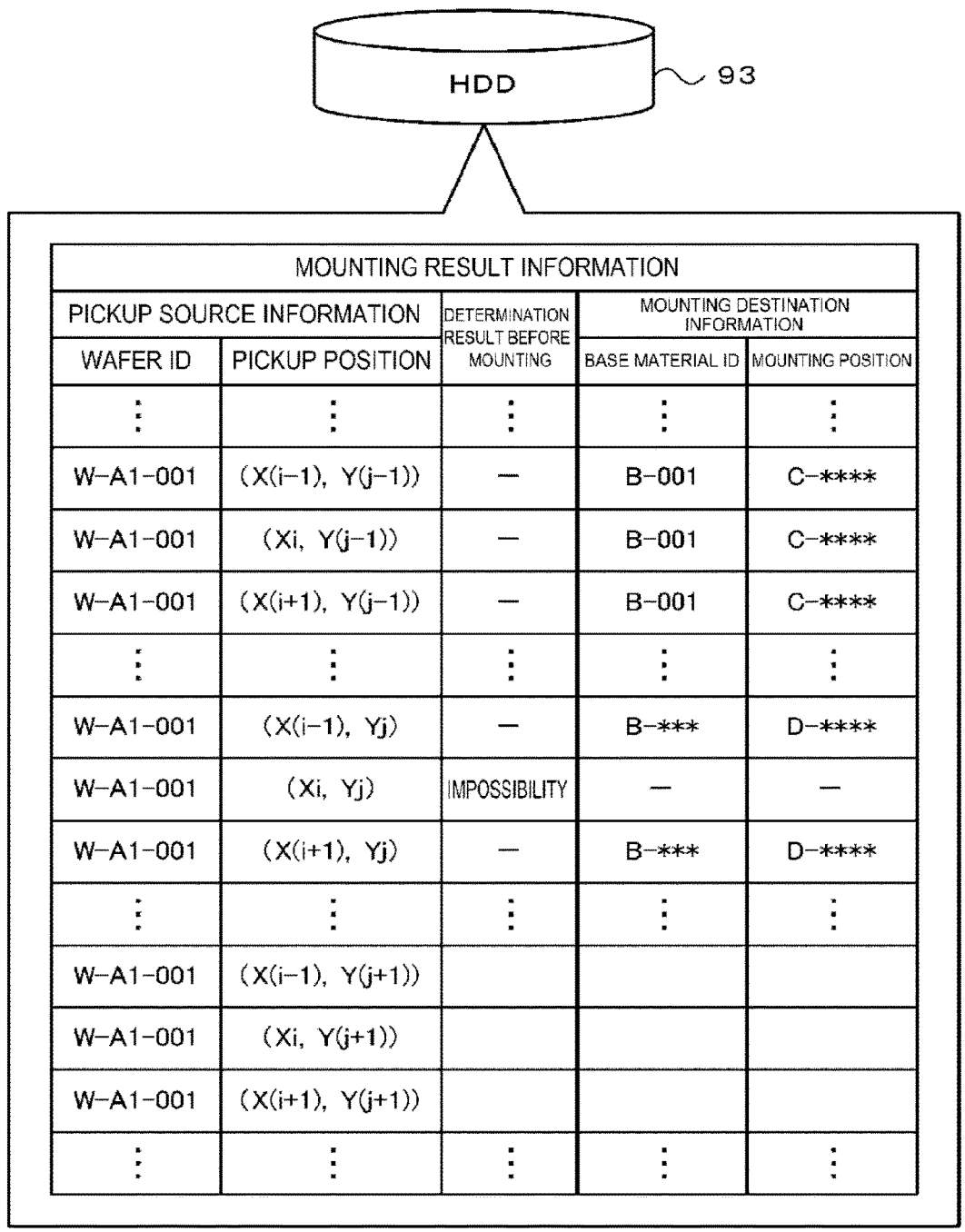
FIG. 12 is an explanatory diagram illustrating an example of mounting result information.
Figure 13:
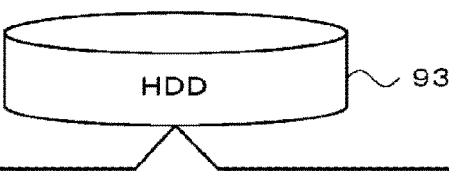
FIG. 13 is an explanatory diagram illustrating an example of failure statistical information.

Next, information management processing performed by CPU 91 of management device 90 will be described. FIG. 9 is a flowchart illustrating an example of mounting-related information management processing, FIG. 10 is a flowchart illustrating an example of skip position registration processing, and FIG. 11 is a flowchart illustrating an example of neighborhood die information output processing. In the mounting-related information management processing of FIG. 9, CPU 91 first determines whether non-mounting information transmitted from mounter 10 has been received in S170 of FIG. 5 (S300), and if it is determined that the non-mounting information has been received, CPU 91 acquires pickup source information and non-mounting reason included in the non-mounting information (S305). Next, CPU 91 reads mounting result information (see FIG. 12) corresponding to a wafer ID of the non-mounting information from HDD 93 (S310), and registers unusability into a determination result of a corresponding pickup position (S315). In addition, CPU 91 reads failure statistical information on a wafer type corresponding to the wafer ID of the non-mounting information from HDD 93 (S320). FIG. 13 is an explanatory diagram illustrating an example of the failure statistical information. As illustrated in the drawing, the failure statistical information is obtained by associating a wafer type, a pickup position of die D, a modulus, the number of failures and an unusable rate of shape failure, the number of failures and an unusable rate of posture failure, and presence or absence of skip position registration. When dies D are picked up and mounted by multiple mounters 10, management device 90 manages failure statistical information as separate statistical information for each mounter 10. If the failure statistical information is read, CPU 91 determines whether the non-mounting reason acquired in S305 is a shape failure (S325), and if it is determined to be the shape failure, CPU 91 updates the unusable rate of the shape failure by incrementing a modulus of the corresponding pickup position and the number of failures caused by the shape failure by 1 in the failure statistical information (S330). Meanwhile, if it is determined not to be a shape failure, that is, a posture failure in S325, CPU 91 updates the unusable rate of the posture failure by incrementing a modulus of the corresponding pickup position and the number of failures caused by the posture failure by 1 in the failure statistical information (S335). If it is determined that the non-mounting information has not been received in S300, CPU 91 skips S305 to S335.

Next, CPU 91 determines whether mounting completion information transmitted from mounter 10 has been received in S150 of FIG. 5 (S340). If it is determined that the mounting completion information has been received, CPU 91 acquires pickup source information and mounting destination information from the mounting completion information (S345), and reads mounting result information corresponding to a wafer ID of the pickup source information from HDD 93 (S350). Then, CPU 91 stores a pickup position of the pickup source information with a base material ID and a mounting position of the mounting destination information in association with each other in the mounting result information (S355). FIG. 12 is an explanatory diagram illustrating an example of the mounting result information. As illustrated in the drawing, respective pickup positions of dies D picked up from wafer W having a wafer ID of "W-A1-001" and mounting destination information (base material ID and mounting position information) are stored in association with each other. Accordingly, if the base material ID and the mounting position information are known as the mounting destination information on die D, it is possible to specify from which wafer W and from which position thereof die D is picked up. In FIG. 12, blanks in a column of determination result indicate that processing of S135 is not performed, and blanks in a column of mounting destination information indicate unmounting. In addition, "C-0017" or the like of the mounting position information indicates a circuit symbol or the like on base material S, but the circuit symbol or the like may be indicated by XY coordinates using a predetermined position as a reference, in the same manner as the pickup position. Subsequently, CPU 91 reads the failure statistical information corresponding to the wafer ID from HDD 93 (S360), updates a failure rate by incrementing a modulus of the corresponding pickup position by 1 in the failure statistical information (S340), and ends the mounting-related information management processing. If it is determined that the mounting completion information has not been received in S340, CPU 91 skips S345 to S365 and ends the mounting-related information management processing.

In the skip position registration processing of FIG. 10, CPU 91 first determines whether there is a position at which the unusable rate is updated in any of S330, S335, and S365 of the mounting-related information management processing (S400), and ends the skip position registration processing if it is determined that there is no updated position. Meanwhile, when it is determined that there is a position at which the unusable rate is updated, CPU 91 determines whether the updated unusable rate is greater than or equal to a predetermined skip threshold (S405), determines whether a modulus of the position, at which the unusable rate is updated, is greater than or equal to a predetermined number (S410), and determines whether the position, at which the unusable rate is updated, is previously registered in the skip position (S415). If it is determined that the updated unusable rate is greater than or equal to the predetermined skip threshold, and it is determined that the modulus of the position at which the unusable rate is updated is greater than or equal to the predetermined number and is not previously registered in the skip position, CPU 91 registers the position at which the unusable rate is updated in a new skip position (S420). Then, CPU 91 transmits skip information including a wafer type and a skip position to mounter 10 (S425), outputs an equipment checking instruction at a position corresponding to the skip position newly registered this time (S430), and ends the skip position registration processing.

If it is determined that the unusable rate is not greater than or equal to a predetermined skip threshold in S405, it is determined that the modulus is not greater than or equal to a predetermined number in S410, or it is determined that the skip position is previously registered in S415, CPU 91 ends the skip position registration processing as it is. When the modulus is less than a predetermined number (for example, several pieces to several tens pieces), the unusable rate may be increased remarkably even if the number of failures is small. Accordingly, the unusable rate tends to be greater than or equal to a skip threshold, and skipping in which tendency of the failure position is not accurately reflected may not be possible. Thus, although the unusable rate is greater than or equal to the skip threshold, if the modulus is less than the predetermined number, CPU 91 does not register in the skip position. Thereby, the tendency of the failure position (statistical information) can be reflected more accurately, and pickup of die D can be skipped from the pickup position in which the failure is apt to occur.

Here, as described above, mounter 10 sets the skip position so as not to pick up die D. Accordingly, management device 90 can prevent die D from being picked up from a pickup position in which an unusable rate tends to be higher by transmitting the skip information in S425, thereby preventing a mounting failure from occurring. In addition, since mounter 10 updates the skip position during the mounting process according to S220 and S225 of FIG. 6, it is possible to quickly reflect the newly registered skip position, resulting in suppress of occurrence of the mounting failure. In addition, since management device 90 can reduce a frequency at which die D is picked up again according to discarding of die D, it is possible to suppress a decrease in efficiency or the like of mounter 10. In addition, it is considered that there is a possibility in which a pickup position with a high failure rate in failure statistical information may have a shape failure such as crack, chip, or a posture failure such as oblique suction pickup caused by an equipment factor such as a push-in failure of suction nozzle 52 or a push-up failure of a push-up pin when die D is picked up. That is, there is a possibility that some kind of equipment failure occurs in mounter 10 at a pickup position in which a failure rate is high in the failure statistical information. Such an equipment failure may affect not only one pickup position, but also peripheral pickup positions. Therefore, CPU 91 outputs the equipment checking instruction at a position corresponding to a skip position newly registered in S430. When receiving the equipment checking instruction, mounter 10 displays meaning thereof on a monitor or the like to urge an operator to inspect equipment. In addition, CPU 91 may display the equipment inspection instruction on display 98.

In addition, mounter 10 does not transmit non-pickup information to management device 90 when it is determined that die D cannot be picked up in S275 of the component pickup process of FIG. 7, and transmits non-mounting information to management device 90 when it is determined that die D cannot be mounted in S170 of the component mounting process of FIG. 5. Accordingly, management device 90 generates statistical information by using a determination result of usability after die D is picked up, except a determination result of usability before die D is picked up. When it is determined that die D is unusable before pickup, it is considered that abnormality exists previously in die D when wafer W is supplied and there is a problem in a manufacturing process of wafer W. Meanwhile, when it is determined that die D is unusable after pickup, it is considered that a shape failure such as crack or chip, which is difficult to detect, has occurred in die D before pickup, or a shape failure or a posture failure has occurred when die D is picked up by mounter 10. In particular, the latter case may be caused by equipment of mounter 10. Accordingly, CPU 91 can easily grasp tendency of a failure position by generating statistical information excluding the determination result before pickup, thereby, being able to be led to appropriate measures.

In neighborhood die information output processing of FIG. 11, CPU 91 first determines whether registration of a skip position has been updated in the skip position registration processing (500), and if it is determined that the registration of the skip position has not been updated, the neighborhood die information output processing ends as it is. Meanwhile, if it is determined that the registration of the skip position has been updated, CPU 91 selects a neighborhood pickup position within a predetermined neighborhood range for the skip position (S505). Then, CPU 91 determines whether there is mounted die D at the neighborhood pickup position by referring to mounting result information (S510), and if it is determined that there is no mounted die D, CPU 91 ends the neighborhood die information output processing. In addition, if it is determined that there is mounted die D, an ID of a base material on which die D at the neighborhood pickup position is mounted and mounting position information are specified by referring to the mounting result information (S515), mounting destination information on a neighborhood die including the specified base material ID and the mounting position is displayed on display 98 (S520), and the neighborhood die information output processing ends.

Figure 14:
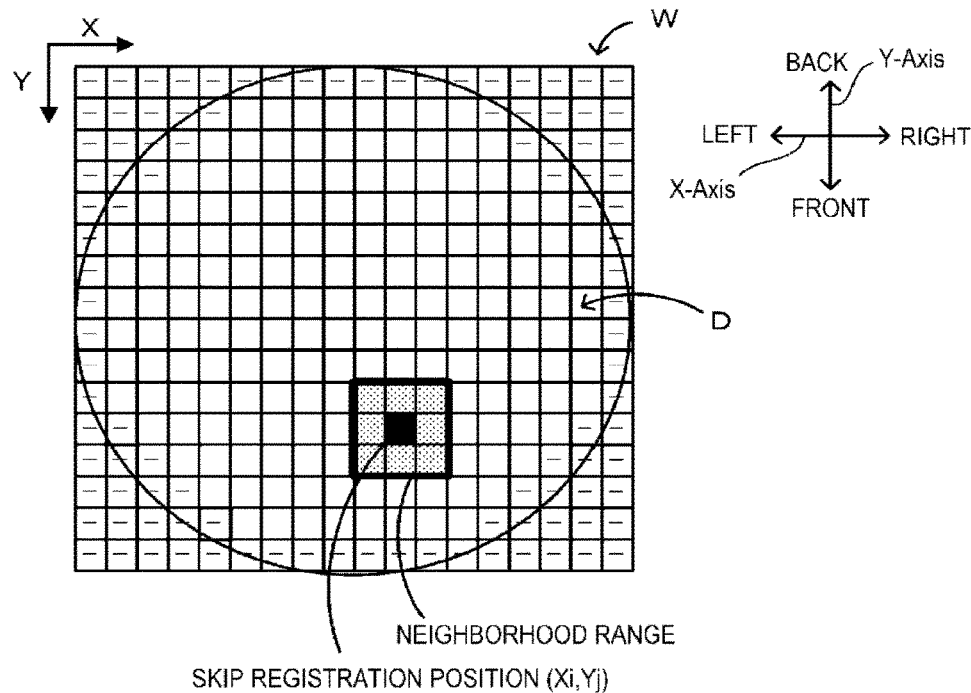
FIG. 14 is an explanatory diagram illustrating an example of a neighborhood range and neighborhood die information.

FIG. 14 is an explanatory diagram illustrating an example of the neighborhood range and the neighborhood die information. As illustrated in FIG. 14(*a*), a range surrounding a pickup position (Xi, Yj) registered in the skip position is referred to as a neighborhood range, and eight pickup positions adjacent to the pickup position (Xi, Yj) are referred to as neighborhood pickup positions. In addition, as illustrated in FIG. 14(*b*), a list of pickup positions and mounting destination information on die D in the neighborhood is displayed together with the pickup position (Xi, Yj) which is a skip position. Unmounted Die D is displayed as a blank in a column for the mounting destination. As described above, when die D in the neighborhood of periphery of the skip position is previously mounted, mounting destination information on die D in the neighborhood is output. Thereby, management device 90 can track and examine whether a same failure occurs in neighborhood die D, thereby, being able to improve quality and to prevent an outflow of a failed component. The configuration is not limited to wafer W to which die D is supplied, and mounting destination information on neighborhood die D may be output retroactively to multiple wafers W for which supply of die D has been completed.

Here, a correspondence relationship between configuration elements of the present embodiment and configuration elements of the present disclosure will be clarified. Management device 90 of the present embodiment corresponds to an information management device, HDD 93 corresponds to an information storage section, CPU 91 that performs processing of S305 of mounting-related information management processing of FIG. 9 corresponds to an information acquisition section, and CPU 91 that performs processing such as S315, S330, S335, and S365 of the mounting-related information management processing corresponds to an information processing section. CPU 91 that performs processing of S400 to S425 of skip position registration processing of FIG. 10 corresponds to an information output section. CPU 91 that performs the neighborhood die information output processing of FIG. 11 also corresponds to the information output section. In the present embodiment, an example of an information management method of the present disclosure is also clarified by explaining an operation of management device 90.

Management device 90 of the first embodiment described above acquires a pickup position of die D on wafer W and a non-mounting reason of die D, and stores the pickup position and meaning of non-mounting in association with each other in HDD 93. Accordingly, it is possible to effectively utilize information to perform a quick analysis of a cause of failure, consideration of countermeasures, and the like without waiting for inspection results or the like of die D mounted on base material S.

In addition, since statistical information on an unusable rate for each pickup position is generated, management device 90 can appropriately grasp tendency of the pickup position of die D which is unusable, thereby, being able to prevent a mounting failure from occurring.

In addition, since a pickup position having a high unusable rate is registered in a skip position so as not to pick up die D from a position thereof, management device 90 can prevent a mounting failure from occurring.

In addition, since mounting destination information on die D, which has been picked up from a position in the neighborhood of a pickup position (specified pickup position) having a high unusable rate, is output, management device 90 can track and examine a mounting state of die D at the neighborhood position to suppress an outflow of a mounting failure.

Second Embodiment

Figure 15:
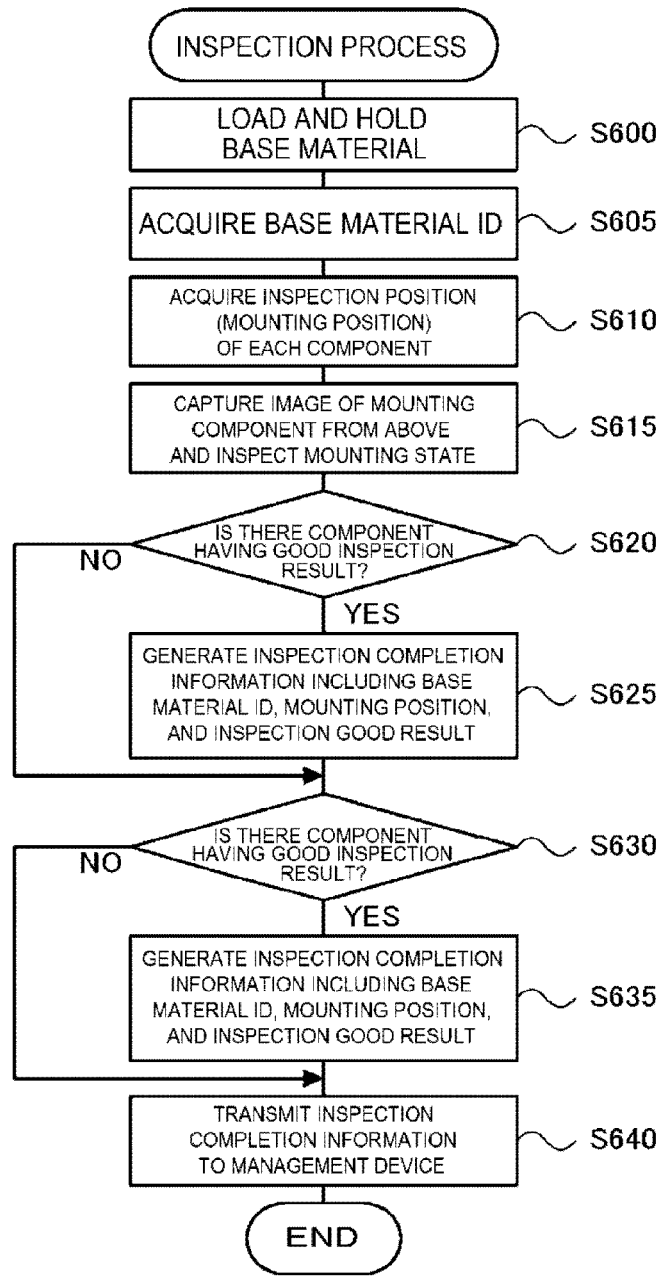
FIG. 15 is a flowchart illustrating an example of inspection processing.

Next, a second embodiment will be described. Since a configuration of a mounting system of the second embodiment is the same as the configuration of the mounting system of the first embodiment, description thereof is omitted. In addition, in the second embodiment, in addition to each processing of the first embodiment, inspection device 70 performs processing using information acquired when base material S (die D) is inspected. FIG. 15 is a flowchart illustrating an example of inspection processing. In this inspection processing, CPU 81 of inspection control device 80 first controls base material conveyance device 72 to load base material S onto base material holding device 74, and then controls base material holding device 74 to hold base material S (S600). Next, CPU 81 captures an image of ID mark on base material S with inspection cameras 78 to acquire a base material ID (S605), and acquires an inspection position (mounting position) of each component based on a command signal transmitted from management device 90 (S610). Subsequently, CPU 81 captures the image of mounted component on base material S with inspection cameras 78 based on the acquired inspection position, and processes the obtained image to inspect a mounting state of the mounted component (S615). If it is determined that there is die D with a good inspection result (S620), CPU 81 generates inspection completion information including the base material ID acquired in S605, the mounting position of die D thereof, and the inspection result (S625). If it is determined that there is die D with a bad inspection result (S630), CPU 81 generates inspection completion information including the base material ID acquired in S605, the mounting position of die D thereof, and the inspection failure result (S635). Then, CPU 81 transmits the inspection completion information generated in S625 or S635 to management device 90 (S640), and ends the inspection processing.

Figure 16:
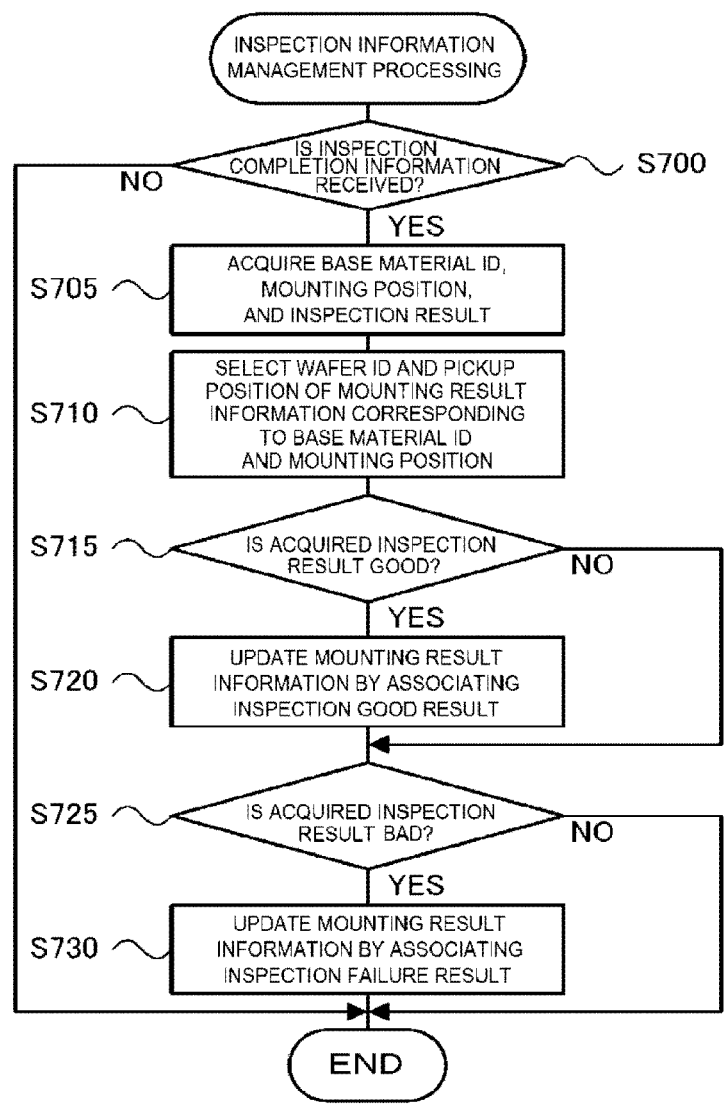
FIG. 16 is a flowchart illustrating an example of inspection information management processing.
Figure 17:
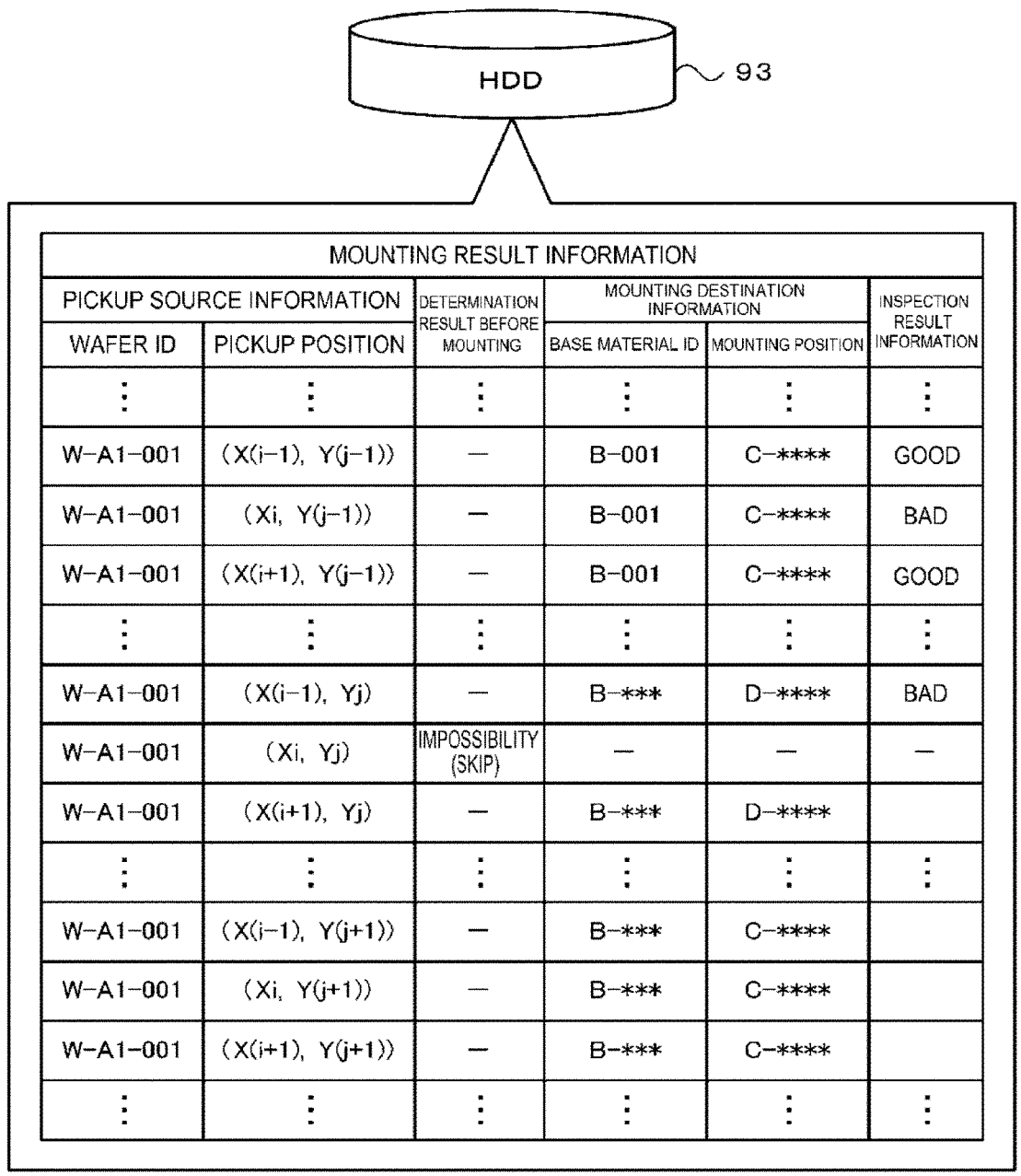
FIG. 17 is an explanatory diagram illustrating mounting result information to which inspection result information is added.
Figure 18:
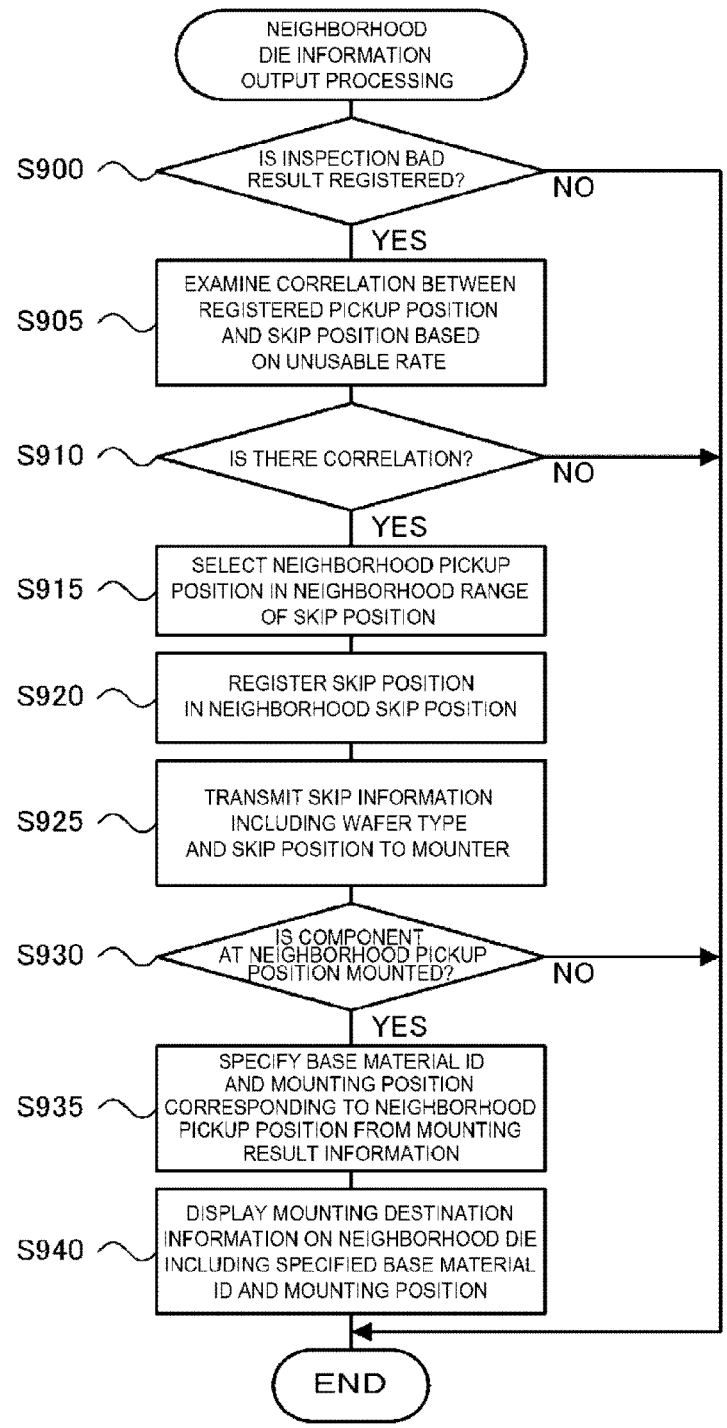
FIG. 18 is a flowchart illustrating an example of neighborhood die information output processing of a second embodiment.

FIG. 16 is a flowchart illustrating an example of inspection information management processing, FIG. 17 is an explanatory diagram illustrating mounting result information to which inspection result information is added, and FIG. 18 is an explanatory diagram illustrating an example of neighborhood die information output processing. The inspection information management processing of FIG. 16 is performed by CPU 91 of management device 90. In the inspection information management processing, CPU 91 first determines whether the inspection completion information transmitted from inspection device 80 in S640 of FIG. 15 is received (S700), and if it is determined that the inspection completion information is not received, CPU 91 ends the inspection information management processing. Meanwhile, when it is determined that the inspection completion information is received, CPU 91 acquires a base material ID, a mounting position, and an inspection result, those included in the inspection completion information (S705), and selects a wafer ID and the pickup position (pickup source information) corresponding to the acquired base material ID and the mounting position by referring to the mounting result information stored in HDD 93 (S710).

Next, CPU 91 determines whether there is die D with a good inspection result which is received (S715), and if it is determined that there is die D with a good inspection result, CPU 91 registers meaning that the inspection result information is good in association with the corresponding wafer ID and the pickup position, and updates the mounting result information (S720). If it is determined that there is no good die D in the received inspection result, S720 is skipped. Subsequently, CPU 91 determines whether there is die D with a bad inspection result that is received (S725), and if it is determined that there is die D with the bad inspection result, CPU 91 registers meaning that the inspection result information is bad in association with corresponding wafer ID and a pickup position, updates the mounting result information (S730), and ends the inspection information management processing. By this processing, as illustrated in FIG. 17, the meaning that the inspection result information is "good" or "bad" is registered in association with the pickup source information and the mounting destination information. In FIG. 17, blanks in a column of inspection result information indicate that the inspection has not been performed.

In addition, in the neighborhood die information output processing of FIG. 18, CPU 91 first determines whether an inspection failure result is registered in the mounting result information during the inspection information management processing of FIG. 16 (S900), and if it is determined that the inspection failure result is not registered, CPU 91 ends the neighborhood die information output processing. Meanwhile, if it is determined that the inspection failure result is registered in S900, CPU 91 examines a correlation between the pickup position in which the inspection failure result is registered and the skip position according to the unusable rate registered in FIG. 10 (S905), and determines whether there is a correlation between both skip positions (S910). For example, when a pickup position at which the inspection failure result is registered and the skip position based on the unusable rate are pickup positions that are adjacent to each other vertically, horizontally, or obliquely, it is assumed that CPU 91 determines that there is a correlation. In the example of FIG. 17, since the pickup position (Xi, Yj) is registered in the skip position and an inspection result is bad at two positions adjacent to the skip position (Xi, Yj), CPU 91 determines that there is a correlation. When an inspection failure result occurs at multiple positions among the pickup positions adjacent to the skip position, CPU 91 may determine that there is a correlation. In addition, when a cause of an inspection failure is specified as a shape failure or a posture failure in the inspection performed by inspection device 70, CPU 91 may include matching of the cause of failure in a condition for determining that there is a correlation. If it is determined that there is no correlation in S910, CPU 91 ends the neighborhood die information output processing.

Meanwhile, if it is determined that there is a correlation in S910, CPU 91 selects a neighborhood pickup position within a predetermined neighborhood range for the skip position based on the unusable rate registered in FIG. 10 (S915), and registers the selected neighborhood pickup position in the skip position (S920).

In addition, CPU 91 transmits skip information including a wafer type and the skip position to mounter 10 (S925). Thereby, when there is a correlation between the skip position based on the unusable rate and the inspection failure result, pickup of die D from the neighborhood pickup position of the skip position is skipped. Here, when there is an between the skip position based on the unusable rate and the inspection failure result, it can be said that a shape failure and the like of die D is likely to occur in the periphery of the skip position, and a failure thereof is likely to be overlooked by mounter 10. Accordingly, by registering the neighborhood pickup position in the skip position, it is possible to further enhance an effect of preventing a mounting failure from occurring.

Next, in the same manner as the neighborhood die information output processing of S510 to S520 of FIG. 11, CPU 91 determine whether die D at the neighborhood pickup position has been mounted by referring to the mounting result information (S930), and if it is determined that mounting is completed, CPU 91 specifies an ID of a base material on which die D at the neighborhood pickup position has been mounted and the mounting position information by referring to the mounting result information (S935), displays mounting destination information on the neighborhood die including the specified base material ID and the mounting position information on display 98 (S940), and ends the neighborhood die information output processing. As described above, in the second embodiment, picking up die D from the neighborhood pickup position is skipped, and mounting destination information on mounted die D at the neighborhood pickup position is displayed. By displaying the mounting destination information, a mounting state of die D at a neighborhood position can be tracked and examined, and thus, an outflow of a mounting failure can be suppressed in the same manner as in the first embodiment.

The present disclosure is not limited to the embodiments described above in any way, and it is needless to say that the present disclosure can be implemented in various aspects as long as the forms belong to the technical scope of the present disclosure.

For example, in the first embodiment, in failure statistical information after die D is picked up, statistical information is generated by distinguishing between a suction pickup posture failure such as a large inclination of a suction pickup posture of die D and a shape failure of die D such as crack or chip, as a non-mounting reason, but the configuration is not limited to this. For example, the statistical information for each pickup position of die D which is determined to be unmountable (unusable) after die D is picked up may be generated without distinguishing the non-mounting reason. In addition, the present disclosure is not limited to that the failure statistical information after pickup of die D is generated and stored in HDD 93, and the information obtained by associating a pickup position with meaning of non-mounting may be stored in HDD 93, and generation of the statistical information may be omitted. In addition, in the mounting result information of FIG. 12, meaning of unusability and the pickup position are registered in association with each other, and moreover, registration may be made according to whether an unusable reason is due to a suction pickup posture failure or a shape failure. In addition, although non-mounting information including pickup source information and non-mounting reason is transmitted to management device 90, mounter 10 may transmit information including a captured image of parts camera 56 used for determination of non-mounting to management device 90. In this case, management device 90 may store the pickup position, the meaning of unusability, and the captured image in association with each other in HDD 93, and the captured image may be used in analyzing a cause of failure, examining countermeasures, or the like by an operator.

In the first embodiment, when it is determined that die D cannot be picked up in component pickup process, information is not transmitted to management device 90, but the configuration is not limited to this. That is, if it is determined that die D cannot be picked up, mounter 10 may transmit non-pickup information including a pickup position to management device 90, and management device 90 may generate statistical information on non-pickup rate for each pickup position by using the non-pickup information. Even by doing so, management device 90 can separately generate the statistical information before pickup of die D and the statistical information after pickup of die D (see FIG. 13), and thus, as described above, it is possible to appropriately grasp tendency of a failure occurrence position to be led to appropriate measures. In addition, management device 90 may register a pickup position having a high non-pickup rate in the statistical information before pickup, in the skip position. By doing so, it is possible to suppress occurrence of a mounting failure due to use of die D at a pickup position thereof, or to suppress a time loss or the like due to repickup because it is determined that die D at the pickup position cannot be picked up.

In the first embodiment, although mounting destination information on die D is displayed in the neighborhood die information output processing, instead of or in addition to this, the pickup of die D at a neighborhood pickup position may be skipped as in the second embodiment. In addition, in the second embodiment, the pickup of die D at the neighborhood pickup position is skipped and the mounting destination information on die D is displayed, but only one of these may be performed.

A base material ID is included in mounting destination information in the neighborhood die information output processing of the first embodiment or the second embodiment, but the configuration is not limited to this, and only a mounting position may be included without including the base material ID in the mounting destination information. Further, a wafer ID is included in a pickup source information in the component pickup process of the first embodiment, but the configuration is not limited to this, and only a pickup position may be included without including the wafer ID in the pickup source information. Even by doing so, statistical information can be generated, and thus, CPU 91 can register a skip position based on an unusable rate.

In the second embodiment, inspection completion information on inspection device 70 is used as an inspection result of die D, but the configuration is not limited to this, and failure occurrence information after product shipment after base material S on which die D is mounted is shipped as a product may be used as the inspection result of die D.

In the second embodiment, the inspection result of die D obtained by inspection device 70 is used for determination of presence or absence of a correlation with the skip position in the neighborhood die information output processing, but the configuration is not limited to this. For example, statistical information on the pickup position and the inspection failure result may be generated, and the pickup position having a high inspection failure rate may be registered in the skip position in the statistical information. In addition, it is determined whether there is a correlation between the skip position based on the inspection failure rate and the skip position based on the unusable rate, and when there is the correlation, a neighborhood pickup position of the skip position based on the unusable rate and a neighborhood pickup position of the skip position based on an inspection failure rate may be registered in the skip position.

Here, in an information management device of the present disclosure, the information processing section can generate statistical information on an unusable rate in which the determination result of the usability is unusable for each pickup position of the component, and stores the statistical information in the information storage section. By doing so, tendency of a position in a wafer of an unusable rate, which is an occurrence rate of an unusable component, can be grasped and thus, it is possible to more effectively utilize information for preventing a mounting failure from occurring and so on.

The information management device of the present disclosure may further include an information output section configured to select a pickup position with a high unusable rate as a specified pickup position, based on the statistical information on the unusable rate, and thereafter output skip information for instructing to skip pickup of the component at the specified pickup position to a mounter included in the mounting system. Thereby, it is possible to suppress occurrence of a mounting failure by preventing a component at a specified pickup position with a high unusable rate from being mounted.

In the information management device of the present disclosure, the information output section may output the skip information instructing to skip the pickup of the component at the neighborhood pickup position to the mounter as countermeasure information for the component at the neighborhood pickup position within a predetermined neighborhood range of the specified pickup position. Here, when a shape failure such as crack or chip occurs in a component at a specified pickup position, a similar failure may also occur in a component at a neighborhood pickup position. Accordingly, by preventing the component at the neighborhood pickup position from being mounted, it is possible to further suppress occurrence of a mounting failure.

In the information management device of the present disclosure, the information acquisition section may acquire information on a mounting position of the component on the base material, the information processing section can store information obtained by associating a pickup position of the component with a mounting position of the component in the information storage section, and the information output section can output information on a mounting destination of the component picked up from the neighborhood pickup position based on information obtained by associating the pickup position of the component with the mounting position of the component as countermeasure information for the component at a neighborhood pickup position within a predetermined neighborhood range of the specified pickup position. By doing so, a mounting state of a component picked up from a neighborhood pickup position can be tracked and examined, and thereby, it is possible to prevent an outflow of a mounting failure and the like.

In the information management device of the present disclosure, the information acquisition section may acquire information on the mounting position of the component on the base material and information on a result of inspection of the component performed on the base material on which the component is mounted, the information processing section can store information obtained by associating the pickup position of the component, the determination result of the usability, the mounting position of the component, and the result of inspection with each other in the information storage section, and the information output section can determine whether there is a correlation between a result determined to be bad in an inspection of the component picked up from the neighborhood pickup position and the specified pickup position, and outputs the countermeasure information when it is determined that there is a correlation. By doing so, countermeasure information can be appropriately output when there is a higher need to deal with a component at a neighborhood pickup position because there is a correlation between an inspection failure result and a specified pickup position.

An information management method of the present disclosure is an information management method of managing information in a mounting system for mounting after determining usability of a component when the component is picked up from a wafer divided into multiple components and is mounted on a base material, and includes (a) a step of acquiring information on a pickup position of the component on the wafer, and information on a determination result of the usability of the component, and (b) a step of storing information obtained by associating the pickup position of the component with the determination result of the usability.

In an information management method of the present disclosure, in the same manner as the information management device described above, information on a pickup position of a component on a wafer and information on a determination result of usability of the component are acquired, and information obtained by associating the pickup position of the component and the determination result of the usability is stored. Thereby, it is possible to grasp tendency of a position of a component determined to be unusable on a wafer from stored information, and to specify a component picked up from the neighborhood of the component determined to be unusable, and so on, and thus, it is possible to effectively utilize the information acquired at the time of mounting and to perform quick measures. Various aspects of the above-described information management device may be adopted in this information management method, and steps for realizing functions of the above-described information management device may be added thereto.

INDUSTRIAL APPLICABILITY

The present disclosure can be applied to a mounting field in which components are picked up from a wafer and mounted on a base material.

REFERENCE SIGNS LIST 1 mounting system, 10 mounter, 12 component supply device, 13 wafer pallet, 14 pallet main body, 14a circular hole, 16 grip ring, 18 adhesive sheet, 19 ID mark, 20, 72 base material conveyance device, 30, 74 base material holding device, 40, 76 moving mechanism, 50 head, 52 suction nozzle, 54 mark camera, 56 parts camera, 60 mounting control device, 61, 81, 91 CPU, 62, 82, 92 ROM, 63, 83, 93 HDD, 64, 84, 94 RAM, 65, 85, 95 input/output interface, 66, 86, 96 bus, 70 inspection device, 78 inspection camera, 80 inspection control device, 90 management device, 97 input device, 98 display, D die, S base material, W wafer

The invention claimed is:

1. An information management device for managing information in a mounting system that mounts a component after determining usability of the component, when the component is picked up from a wafer divided into multiple components and is mounted on a base material, the information management device comprising:
an information storage section configured to store various types of information;
an information acquisition section configured to acquire information on a pickup position of the component on the wafer and information on a determination result of usability of the component; and
an information processing section configured to store information obtained by associating the pickup position of the component with the determination result of the usability in the information storage section, wherein
the information processing section generates statistical information on an unusable rate in which the determination result of the usability is unusable for each pickup position of the component, and stores the statistical information in the information storage section,
the information management device further comprises an information output section configured to select a pickup position with a high unusable rate as a specified pickup position, based on the statistical information on the unusable rate, and thereafter output skip information for instructing to skip pickup of the component at the specified pickup position to a mounter included in the mounting system,
the information acquisition section acquires information on a mounting position of the component on the base material,
the information processing section stores information obtained by associating the pickup position of the component with the mounting position of the component in the information storage section, and
the information output section outputs information on a mounting destination of the component picked up from a neighborhood pickup position based on the information obtained by associating the pickup position of the component with the mounting position of the component as countermeasure information for the component at the neighborhood pickup position within a predetermined neighborhood range of the specified pickup position.

2. The information management device according to claim 1, wherein the information output section outputs the skip information instructing to skip the pickup of the component at the neighborhood pickup position to the mounter as the countermeasure information.

3. The information management device according to claim 2,
wherein the information acquisition section acquires information on a result of inspection of the component performed on the base material on which the component is mounted,
wherein the information processing section stores information obtained by associating the pickup position of the component, the determination result of the usability, the mounting position of the component, and the result of inspection with each other in the information storage section, and
wherein the information output section determines whether there is a correlation between a result determined to be bad in the inspection of the component picked up from the neighborhood pickup position and the specified pickup position, and outputs the countermeasure information when it is determined that there is the correlation.

4. An information management device for managing information in a mounting system that mounts a component after determining usability of the component, when the component is picked up from a wafer divided into multiple components and is mounted on a base material, the information management device comprising:
an information storage section configured to store various types of information;
an information acquisition section configured to acquire information on a pickup position of the component on the wafer and information on a determination result of usability of the component; and an information processing section configured to store information obtained by associating the pickup position of the component with the determination result of the usability in the information storage section, wherein the information processing section generates statistical information on an unusable rate in which the determination result of the usability is unusable for each pickup position of the component, and stores the statistical information in the information storage section, the information management device further comprises an information output section configured to select a pickup position with a high unusable rate as a specified pickup position, based on the statistical information on the unusable rate, and thereafter output skip information for instructing to skip pickup of the component at the specified pickup position to a mounter included in the mounting system, the information output section outputs the skip information instructing to skip the pickup of the component at a neighborhood pickup position to the mounter as countermeasure information for the component at the neighborhood pickup position within a predetermined neighborhood range of the specified pickup position, the information acquisition section acquires information on a mounting position of the component on the base material and information on a result of inspection of the component performed on the base material on which the component is mounted, the information processing section stores information obtained by associating the pickup position of the component, the determination result of the usability, the mounting position of the component, and the result of inspection with each other in the information storage section, and the information output section determines whether there is a correlation between a result determined to be bad in the inspection of the component picked up from the neighborhood pickup position and the specified pickup position, and outputs the countermeasure information when it is determined that there is the correlation.

5. The information management device according to claim 4, wherein the information processing section stores information obtained by associating the pickup position of the component with the mounting position of the component in the information storage section, and the information output section outputs information on a mounting destination of the component picked up from the neighborhood pickup position based on the information obtained by associating the pickup position of the component with the mounting position of the component as the countermeasure information.

6. The information management device according to claim 5, wherein the processor is further programmed to:

acquire information on a result of inspection of the component performed on the base material on which the component is mounted, determine whether there is a correlation between a result determined to be bad in the inspection of the component picked up from the neighborhood pickup position and the specified pickup position, and output the countermeasure information when it is determined that there is the correlation.

7. The information management device according to claim 4, wherein the processor is further programmed to output the skip information instructing to skip the pickup of the component at the neighborhood pickup position to the mounter as the countermeasure information.

* * * * *